United States Patent [19]

Holden

[11] Patent Number: 4,535,835
[45] Date of Patent: Aug. 20, 1985

[54] OPTIMUM SURFACE CONTOUR FOR CONDUCTIVE HEAT TRANSFER WITH A THIN FLEXIBLE WORKPIECE

[75] Inventor: Scott C. Holden, Manchester, Mass.

[73] Assignee: Varian Associates, Inc., Palo Alto, Calif.

[21] Appl. No.: 631,527

[22] Filed: Jul. 18, 1984

Related U.S. Application Data

[63] Continuation of Ser. No. 381,668, May 25, 1982, abandoned.

[51] Int. Cl.³ .............................................. F28F 9/00
[52] U.S. Cl. .................................. 165/80 R; 51/324; 118/728; 165/185; 269/26
[58] Field of Search .................. 51/217 L, 235, 324; 118/724, 725, 726, 727, 728; 165/80 R, 80 A, 80 B, 80 C, 80 D, 185; 269/26

[56] References Cited

U.S. PATENT DOCUMENTS 4,282,924  8/1981  Faretra ............................. 165/80 E

OTHER PUBLICATIONS

Ultra-High Vacuum Evaporation/Sputtering Apparatus for Cryogenic Thin Film Technology, Carbone et al, I.B.M. Tech. Disc. Bull., vol. 22, No. 2, Jul. 1979, pp. 550-554.

Primary Examiner—Sheldon J. Richter
Attorney, Agent, or Firm—Stanley Z. Cole; William R. McClellan; Edward H. Berkowitz

[57] ABSTRACT

Conductive heat transfer between a thin deformable workpiece and heat sink is optimized by imposing a load over the workpiece resulting in a uniform contact pressure distribution in said workpiece which is also the maximum stress consistent with the elastic properties of the workpiece. The surface of the heat sink is given a contour determined by these criteria for a thin circular disk clamped thereto.

10 Claims, 5 Drawing Figures

OPTIMUM SURFACE CONTOUR FOR CONDUCTIVE HEAT TRANSFER WITH A THIN FLEXIBLE WORKPIECE

This application is a continuation of application Ser. No. 381,668, filed May 25, 1982, now abandoned.

DESCRIPTION

FIELD OF THE INVENTION

The invention is related to heat transport involving objects and thermal reservoirs, and in particular, to cooling of semiconductor wafers subject to processing by ion implantation, sputtering or like processes.

BACKGROUND OF THE INVENTION

In processing steps wherein the workpiece is subject to a high intensity radiation flux, heat developed in the workpiece may become a limiting factor for the process. In particular, for ion implantation of semiconductor materials, an upper limit on the workpiece temperature is recognized for several reasons. Where the wafer is coated with a resist layer as part of a lithographic process, deterioration or alteration of that layer will occur for temperatures elevated much in excess of 100° C. Wafers subject to prolonged irradiation may also experience undesirable diffusion of previously formed regions of distinct incremental properties within the semiconductor or a premature annealing of previously bombarded regions may occur.

It is therefore a matter of importance to provide for the removal from the semiconductor wafer of heat developed therein consequent to ion implantation processes or like irradiation.

It is known in the prior art to provide active cooling for semiconductor wafers during ion implantation by clamping such wafers to a convexly curved platen which includes a coating of a pliable thermally conductive material on the surface of the platen. A clamping ring cooperating with the platen is arranged to firmly press a semiconductor wafer against the compliant surface of the convexly curved platen to facilitate a thermal energy transfer from the wafer to active cooling means provided within the platen. Such a system is described in U.S. Pat. No. 4,282,924 commonly assigned with the present invention.

The aforementioned art relies upon a conductive mechanism for thermal transport. Thermal energy is developed in proximity to the outer surface of the wafer from the kinetic energy of the incident beam which is absorbed by the wafer. There is, therefore, a first component of thermal conductivity implicit in the thermal conductance properties of the wafer material because of the necessity of heat transport through the wafer material. (It will be assumed for simplicity that the thermal path is through the thickness of the wafer.) Similarly, the platen exhibits thermal conductance properties characteristic of the material comprising the platen in effecting heat transfer between the surface of the platen in contact with the wafer, thence through the interior regions of the platen wherein cooling channels are disposed for circulating cooling fluids. In the intermediate contact region between the wafer and the platen there is a distinct contribution to thermal transfer properties. The thermal conductance in this region is nearly proportional to the actual contact area between the wafer and platen and inversely proportional to the mean thermal conductivity of the two materials. On the microscopic scale, the surfaces are quite nonplanar and of irregular orientation; on the basis of certain assumptions of the hardness of materials and surface topography distributions of the respective contact surfaces, the contact area is calculable for microscopic measurement and is, in fact, but a small fraction of the macroscopic area. The theory of conductive heat transport between solid bodies in a vacuum is developed by Cooper, Mikic and Yovanovich, Int. J. Heat and Mass Transfer, Vol. 12, pp. 279-300 (1969) where it is shown that the contact thermal conductance depends upon the conductances and the actual contact area which in turn depends upon the surface density of deviations from planarity of the meeting surfaces and the elastic or plastic compliance of the materials. Irregularities may, by impressed forces bearing thereon, be deformed to initially contact, or to more nearly conform with one another, e.g., yielding a greater contact area. The desirable effect of greater contact area is limited by the maximum stress which can be sustained by the wafer. In U.S. Pat. No. 4,282,924 the platen is in fact a composite of a high heat capacity metal body, of unspecified convex curvature, to which is bonded a thermally conductive compliant outer layer for contacting the wafer. Thus, there is provided a surface layer which deforms to accommodate some portion of the small scale irregularities of the wafer. There is, in this example, a further geometrical attribute in the length of the thermal path through the compliant material, which length is proportionately shortened as the contact pressure increases. This effect appears in first order but is quite small for the small deformations usually encountered.

The effect of variables which influence the thermal impedance of the interface was recognized as providing a selectably controllable thermal impedance where it is desired to sustain a preselected wafer temperature relative to the heat sink. U.S. Pat. No. 4,453,080, commonly assigned, discusses an example of this attribute.

It is therefore an object of the present invention to provide an apparatus for improving the effective cooling of semiconductor wafers during ion implantation and especially with respect to the uniformity of such cooling.

SUMMARY OF THE INVENTION

An apparatus for improved heat transfer for semiconductor wafers subject to a radiation flux includes a platen to which the wafer is clamped, preferably at the periphery thereof. The platen is given a contour which optimizes the heat transfer through the wafer to the platen independent of location on the surface of the wafer. The contour to which the wafer conforms on the platen is computed to correspond to that surface for which the contact pressure distribution between the wafer and platen will be uniform over the remaining surface of the wafer for the boundary conditions specified by the clamping means which secures the wafer to the platen. The magnitude of the contact pressure is maximized to the magnitude which can be tolerated by the wafer without fracture of the latter.

In one embodiment the platen comprises a rigid metal member and a compliant layer bonded thereon. The properties of the compliant layer and this inner contour of the member at the bonding surface control an outer effective contour which meets the above-stated requirement.

In either approach, the platen preferably includes active cooling means for efficiently removing heat therefrom.

DETAILED DESCRIPTION OF THE PRESENT INVENTION

Figure 1:
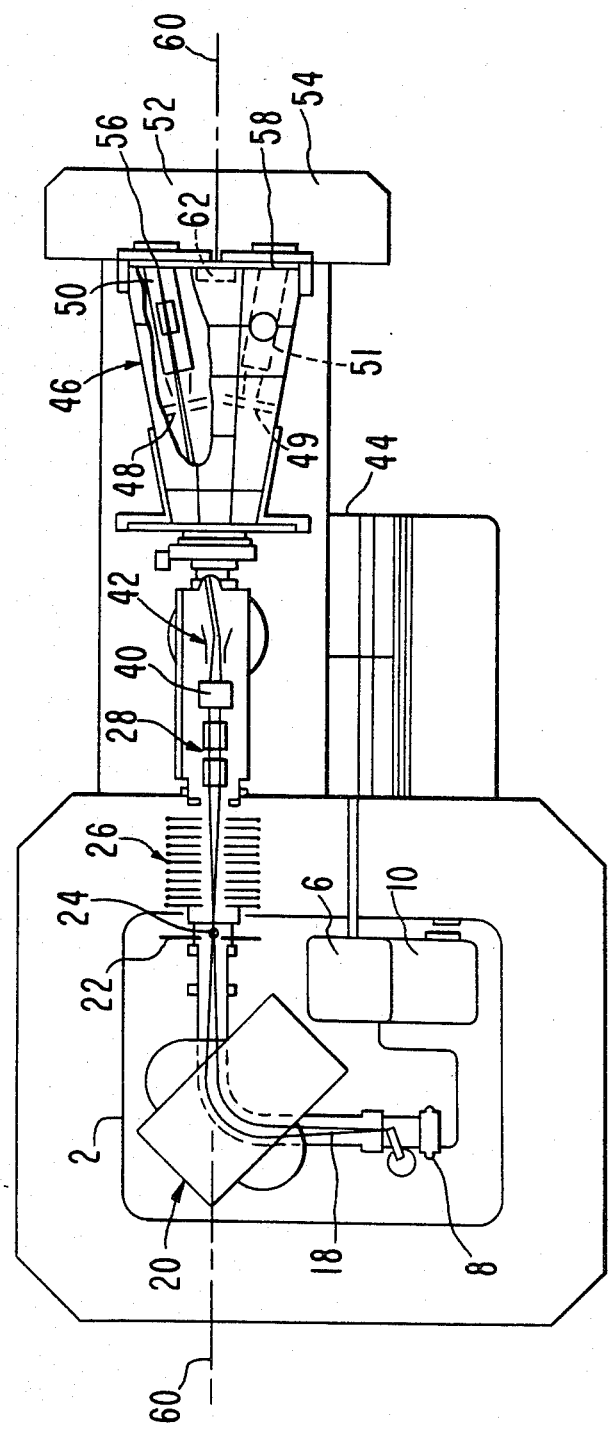
FIG. 1 is a schematic illustration of a typical ion implantation system including the present invention.

The context of the present invention is best described with the aid of FIG. 1 which illustrates a typical ion implantation system. A high voltage terminal 2 is maintained at a selectable potential of +10 kev to +200 kev, typically, with respect to ground. Within the terminal 2 there is located an ion source 8 and associated power supplies 10, providing extraction, probe and focusing potentials which need not be considered in detail for the present purposes. Typically the ion source operates on a gaseous feed stock requiring gas handling system 6 which may be employed to select among several gas cylinders and to supply the selected gas to the ion source through a controlled leak. A high current ion beam 18 diverging from the ion source 8 is momentum analyzed in analyzer magnet 20 and issues from the magnet defined by aperture 22 and further limited by variable slit system 24. The beam is then accelerated to ground potential in accelerating tube 26. Optical elements 28 such as a quadrapole doublet, operate on the beam to yield a spatial momentum focus at the target planes 56 or 58. The typical system of FIG. 1 utilizes an electrostatic deflection system including y deflection plates 40 and x deflection plates 42 to direct the beam 18 over the selected target plane. The waveforms are developed in scan system 44 for application to the plates 40 and 42 to achieve a desired scanning pattern. A dual channel target chamber 46 is provided to house the workpiece(s) subject to processing. Included in the target chamber are beam defining slits 48 and 49 for the respective processing channels and Faraday cages 50 and 51 for charge collection and integration. An automatic wafer handling system including feed channels 52 and 54 service the two processing channels for introducing semiconductor wafers, one at a time through each of two vacuum locks for timestaggered introduction into the target chamber. The wafer handling system properly locates, aligns, and cools the wafer during processing and removes the processed wafer from the chamber at the conclusion of processing. The wafer handling system is described in U.S. Pat. No. 4,449,885 commonly assigned with the present invention.

It is understood that the entire region traversed by the ion beam is maintained at high vacuum, e.g., typically pressures of the order of $10^{-6}$ mm.hg.

Figure 2A:
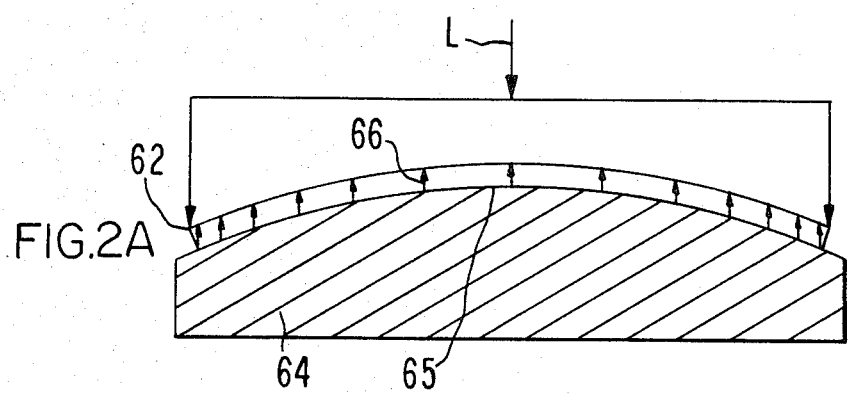
FIG. 2A is a schematic illustration of a nonoptimally contoured platen and wafer clamp thereon.

It is observed that, as in FIG. 2A, clamping force L applied at the periphery of the wafer 62 may result in a non-uniform distribution of contact forces over the surface of the wafer. This results in a non-uniform loading of the wafer where the load is defined by the platen 64 of arbitrary convex surface contour 65. The local stress is represented symbolically by stylized vector components 66, one of which is so labeled. The thermal conductance of the interface between wafer 62 and platen 64 is a function of the contact force exerted on the wafer against the platen and the thermal and mechanical properties of the materials. As described above, this is due in part to the microscopic surface roughness and compressibility of the microscopic material features of both wafer and platen and the resulting contact area of the respective materials which may vary in proportion to the applied force. In a typical peripherally clamped wafer cooling platen of convex spherical shape as in FIG. 2A, it is found that a region of relatively elevated temperature generally develops in the central region of the wafer during processing due to a decrease in the local contact pressure.

An optimum platen profile follows from derivation of the equation which describes a uniformly loaded thin disc supported along its periphery. This problem is discussed by Marguerre and Woernle, "Elastic Plates", Chapter 11, Blaisdell Publishing Co., Waltham, Mass., 1969. From this reference one can derive an expression for the deflection y(r) for a uniformly loaded peripherally supported thin flexible disc in order to obtain $$y(r) = \left(\frac{p}{E t^3}\right) \frac{3(1 - v^2)}{16} \left(r^4 - \frac{D^2(3 + v)}{2(1 + v)} r^2\right) \quad \text{Eq. 1}$$

where
r = radial position
D = $2r_0$, the wafer diameter
t = wafer thickness
p = pressure applied to wafer.
E = elastic modulus
$v$ = Poisson's ratio The deflection described by equation (1) above fulfills one criteria for optimized contact cooling perceived in this work, e.g., uniform contact pressure distribution applied to the wafer. In order to maximize heat transport from the wafer to the platen, it is further desired to maximize the contact force between the wafer and the platen. Limits are imposed on the maximum contact force by properties of the wafer material. As the wafer is deformed against a convex surface, the tangential stress components (tangential with respect to the normal contact forces) place the wafer under compression near its inner surface and under tension near its outer (convex) surface due to imposed bending. The respective surface tangential stress components exhibit a magnitude which delimit the design parameters, (especially the tensile stress at the outer surface).

For a thin uniformly loaded flexible disc the maximum surface stresses resulting from this imposed deflection are given by $$\sigma = p \left(\frac{v_o}{t}\right)^2 \left[\frac{3}{8}(3 + v)\right] \quad \text{Eq. 2}$$

and the maximum pressure is limited by the maximum tensile stress to which the wafer is safely subject as $$p = \left(\frac{t}{v_o}\right)^2 \left(\frac{8}{3}\right) \left(\frac{1}{3 + v}\right) \sigma_{max}$$

where
p = contact pressure
$v$ = Poisson's ratio $\delta$ = tensile stress on outer surface
$\delta_{max}$ = maximum tensile stress tolerable
and $r_0$ and $t$ are as given above.

It can also be shown that for the thin uniformly loaded flexible disc of equation 2, the maximum deflection is given by $$y_{max} = p \frac{3 D^4}{256 E t^3} \frac{(5 + \nu)(1 - \nu^2)}{(1 + \nu)} \quad \text{Eq. 3}$$

or, in terms of $\sigma_{max}$ $$y_{max} = \frac{D^4}{32 E t^3} \frac{(5 + \nu)(1 - \nu)}{(3 + \nu)} \sigma_{max}$$

A dimensionless expression is formed by dividing equation 1 by equation 3 which describes the desired contour for the platen.

$$\frac{y(r)}{y_{max}} = \left(\frac{1 + \nu}{5 + \nu}\right) \left[\left(\frac{r}{v_o}\right)^4 - \frac{2(3 + \nu)}{1 + \nu}\left(\frac{r}{v_o}\right)^2\right] \quad \text{Eq. 4}$$

Equation 4 therefore expresses the concurrent conditions which yield uniformity of heat transfer over the surface of the wafer and maximum heat transfer from the wafer. It is noted that equation 4 has no dependence on Young's modulus and that Poisson's ratio varies little within a wide class of materials. Equation 4 expresses a uniformly applicable contour for the proposed purpose. In actual use the value of $Y_{max}$ imposes a constraint on the amplitude or scale of the curve, but it is noted that again a variety of different wafer materials may be accommodated without substantial sacrifice of thermal transfer properties.

Figure 2B:
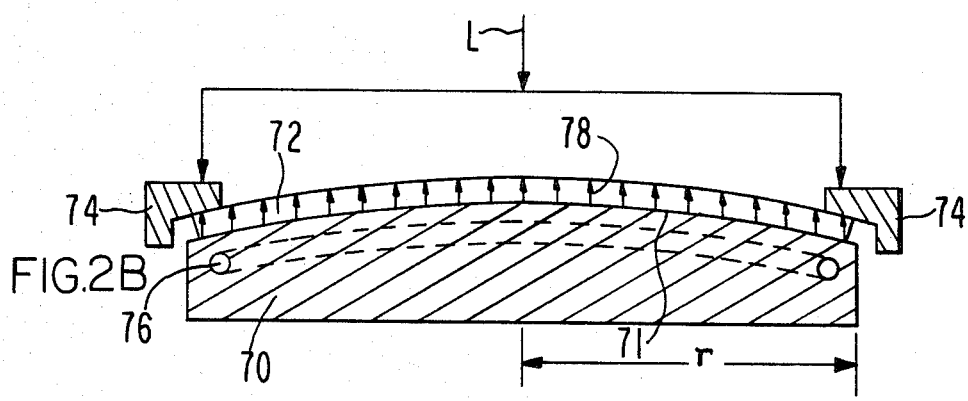
FIG. 2B illustrates the effect of the present invention.

Thus, in FIG. 2B, the platen 70 of the present invention has a surface contour 71 described by equation 4. The wafer 72 is urged against the platen 70 by peripheral clamping ring 74 under a clamping force L. Cooling channels 76 are provided in the platen for the further removal of heat. The stress distribution represented symbolically by vector component 78 is observed to be uniform over the wafer as a result of the boundary condition of peripheral clamping and the uniform contact pressure loading imposed by conformance of the wafer 72 with the contour 71. For the magnitude of contact force $L_o$ for which contact is achieved over the entire wafer surface the contact pressure will assume a value which does not change for further increase in L. Further increase in contact force $\Delta L$ is simply transmitted through the wafer to the substrate without affecting the distributed load.

Figure 2C:
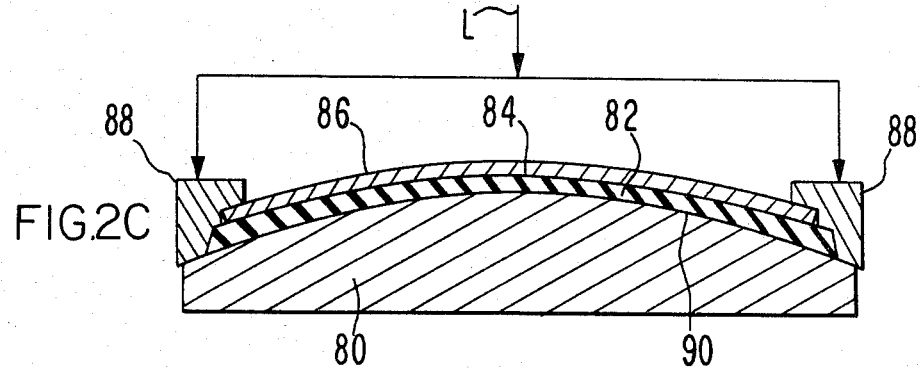
FIG. 2C shows another embodiment of the invention.

In another embodiment (FIG. 2C) the platen assembly may comprise a rigid member 80 and a compliant thermally conductive coating 82. The intermediate contour 90 of the rigid member 80 is determined taking into consideration the properties of the compliant material 82 and the load to which the wafer 86 will be subject in order that the interface contour 84 between wafer 86 and platen 80, under the design load conditions, will conform to that desired contour yielding a contact pressure distribution which is uniform over the surface of the platen-wafer interface for the boundary conditions determined by the clamping of the wafer to the platen. In the most straight forward approach the compliant layer exhibits a uniform thickness bonded to the intermediate contour 90 with the result that the interface contour 84 and intermediate contour 90 will be substantially identical. In the general case a compressed compliant layer may exhibit a radial thickness distribution due to increased perimeter loading, requiring a complex design procedure. Such design is most easily accomplished by an iterative procedure in a computer model for which the function $y_1(r,\theta)$ representing intermediate contour 90 of the bare platen is varied to yield the desired outer contour, $y_0(r,\theta)$, taking account of the deformation of the compliant layer 82. For a boundary condition prescribed by continuous peripheral clamping, the $\theta$ dependence vanishes and these functions have radial symmetry.

For typical silicon wafers of production dimensions (100 mm. diameter and 525 microns thickness) a tensile bending stress of 8000 psi is tolerable. A maximum deflection of 0.0529" is taken as the amplitude of the contour given by equation 4. A contact pressure of 0.67 psi is maintained against an aluminum (6061-T6) heat sink so contoured. The thermal contact resistance is found to be about 65° C./watt/cm$^2$ in vacuum. In a specific instance, the aluminum platen body, the compliant substrate and the typical wafer contribute, respectively, 0.31, 2.11 and 0.033°–0.074° C./watt/cm$^2$. As expected the contact impedance, is the dominant contribution to the total thermal impedance, but the actual value of the thermal contact resistance is quite dependent upon the surface properties of the heat sink and wafer. Soft aluminum or indium are believed to offer excellent properties for this purpose. Pliable materials offer good properties with the possible advantage of tolerating surface dust.

In a related aspect of the invention, a gas is introduced within the wafer-platen interface region to a pressure approximately equal to the contact pressure for enhanced heat transfer. This subject material is described in U.S. Pat. No. 4,457,359 commonly assigned.

Figure 3:
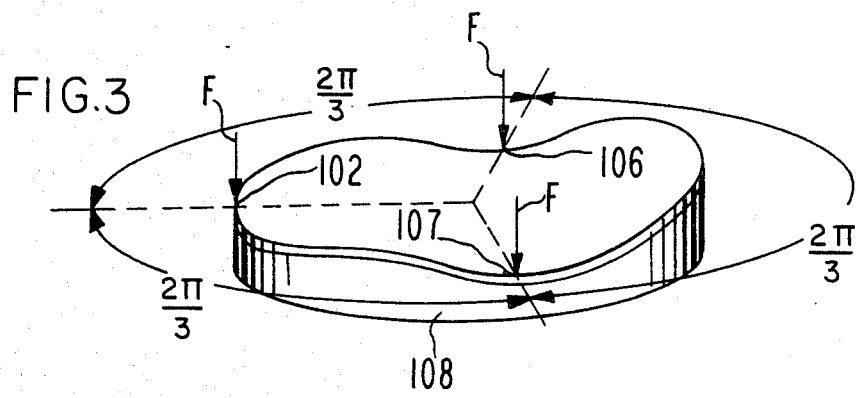
FIG. 3 illustrates an alternate clamping embodiment.

Alternate clamping arrangements may also be considered. One such alternate clamping arrangement will apply equal clamping forces L to the wafer at discrete points symmetrically disposed, as shown for example in FIG. 3, at three points equally spaced along the periphery of the wafer. In this instance a complex saddle-shaped contour will result. That is, the wafer will be deformed with a surface $y(r,\theta)$ where $\theta$ is the azimuthal angle around the periphery. Such a surface may be computed with reference to Marguerre and Woernle, above referenced. The platen 108 is provided with such a saddle-shaped contour further constrained by the maximum deflection condition. The achievement of the complex contour required may readily be obtained using modern multiple axis machining techniques. Alternatively the platen 108 may be so formed as in the afore described embodiment with a compliant layer to facilitate the desired contour with the more complex computations so required. An advantage obtained in this discrete clamping embodiment is the additional wafer area accessible for production of devices on the wafer. The fractional surface area given over to a continuous peripheral clamp of width w is $$\frac{2\pi r_0 \omega}{2\pi r_0^2} = \frac{\omega}{r_0}$$

which is of the order of a few percent for typical values of w(2 mm.) and $r_o$. This embodiment is the subject of U.S. Pat. No. 4,458,746.

Although the discussion has been directed to obtaining a uniform contact pressure between the wafer and a heat sink member, it is clearly understood that another desired distribution can be obtained in like manner. For example, a temperature gradient may be desired for particular processing steps other than the examples discussed and the corresponding contact force distribution may be obtained by appropriate design of the contact contour.

The discussion has been framed in the context of removal of heat from a semiconductor wafer during ion implantation. One will readily recognize that ion implantation is but one form of radiation processing for which the invention is well suited. Moreover, the conductive transfer of heat away from thin flexible discs is closely related to the conductive transfer of heat into such materials; therefore, processes directed to heating a thin flexible workpiece would similarly benefit from the invention. While the discussion has employed a thin flexible disc as an example, the invention could be applied to a workpiece of other than circular symmetry or of non-uniform thickness or non-flat surface profile. One skilled in the art will recognize that a thin flexible workpiece of specified geometry and material and specified boundary condition are all that is necessary to obtain a contour for the desired loading condition of the workpiece consistent with the invention. Various other changes and modifications will be recognized to be similarly closely related to the subject matter of the invention which should be defined in view of the appended claims.

What is claimed is:

1. Apparatus for removal of heat from a planar article under irradiation by a radiation source, said apparatus comprising:
   heat sink means for removal of heat transferred thereto from said article, said heat sink means including a nonplanar, nonspherical convex contact surface; and
   clamping means for securing a peripheral portion of said planar article to said contact surface such that said article conforms to said contact surface, said contact surface having a contour which cooperates with said clamping means to impose uniformity of contact pressure over the surface area of said article in contact with said contact surface and to stress said article to approach the limiting elastic stress thereof.

2. The apparatus of claim 1 wherein said article is a disc of radius $r_o$ and thickness t, said peripheral portion comprises a narrow continuous region at the periphery of said disc, and said contour has the general mathematical form $$y(r) = y_{max}\, \alpha \left( \frac{r^4}{r_o^4} - \beta \frac{r^2}{r_o^2} \right)$$

where $\alpha$ and $\beta$ are constants, $y_{max}$ is the maximum deflection of the disc and y is the elevation of said contour from the radial plane at the radial coordinate r.

3. The apparatus as defined in claim 2 wherein said disc comprises a semiconductor wafer.

4. The apparatus of claim 2 wherein said clamping means cooperates with said contact surface to produce a tensile stress component at the outer convex surface of said disc which approaches the elastic limit.

5. The apparatus of claim 4 wherein the quantity $\alpha$ is given by $$\left( \frac{1+\nu}{5+\nu} \right)$$

and the quantity $\beta$ is given by $$\frac{2(3+\nu)}{1+\nu}$$

where $\nu$ is Poisson's ratio for said planar article.

6. Apparatus for transfer of thermal energy with a thin, flexible workpiece in vacuum comprising:
   a thermally conductive member for transfer of thermal energy to or from said workpiece, said member including a nonplanar, nonspherical contact surface; and
   clamping means for securing a peripheral portion of said workpiece to said contact surface such that said workpiece conforms to said contact surface, said contact surface having a contour which is selected to cooperate with said clamping means to impose uniformity of contact pressure over the surface area of said workpiece in contact with said contact surface and to stress said workpiece to approach the limiting elastic stress thereof, the selection of said contour being based on the geometry and material of said workpiece and the forces imposed upon said workpiece by said clamping means.

7. The apparatus of claim 6 wherein said clamping means cooperates with said contact surface to produce a tensile stress component at the outer surface of said workpiece which approaches the elastic limit.

8. The apparatus of claim 6 wherein said workpiece is a disc of radius $r_o$, said peripheral portion comprises a narrow continuous region at the periphery of said disc, and said contour has the general mathematical form $$y(r) = y_{max}\, \alpha \left( \frac{r^4}{r_o^4} - \beta \frac{r^2}{r_o^2} \right)$$

where $\alpha$ and $\beta$ are constants, $y_{max}$ is the maximum deflection of the disc and y is the elevation of said contour from the radial plane at the radial coordinate r.

9. The apparatus as defined in claim 8 wherein said disc comprises a semiconductor wafer.

10. The apparatus as defined in claim 9 further including
   an ion source and means for directing an ion beam from said ion source to said semiconductor wafer and
   a vacuum chamber enclosing said ion source, said means for directing an ion beam, said thermally conductive member and said clamping means, said thermally conductive member comprising a heat sink for removal of heat from said semiconductor wafer during irradiation by said ion beam.

* * * * *